United States Patent
Ozawa et al.

(10) Patent No.: US 7,635,890 B2
(45) Date of Patent: Dec. 22, 2009

(54) SEMICONDUCTOR DEVICE

(75) Inventors: Yoshio Ozawa, Yokohama (JP); Akihito Yamamoto, Naka-gun (JP); Masayuki Tanaka, Yokohama (JP); Katsuaki Natori, Yokohama (JP); Katsuyuki Sekine, Yokohama (JP); Daisuke Nishida, Yokohama (JP); Ryota Fujitsuka, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 126 days.

(21) Appl. No.: 11/783,934

(22) Filed: Apr. 13, 2007

(65) Prior Publication Data

US 2007/0241389 A1    Oct. 18, 2007

(30) Foreign Application Priority Data

Apr. 14, 2006  (JP) ............................. 2006-112191

(51) Int. Cl.
*H01L 29/76* (2006.01)
(52) U.S. Cl. .................. 257/315; 257/314; 257/E29.3; 257/E29.309
(58) Field of Classification Search .............. 257/314, 257/315, 317, 321, 325, 390, E29.3, E29.304, 257/E29.309
See application file for complete search history.

(56) References Cited

U.S. PATENT DOCUMENTS

| 7,005,714 B2* | 2/2006 | Ozawa et al. ............... 257/390 |
| 7,109,549 B2* | 9/2006 | Ozawa ......................... 257/315 |
| 7,427,533 B2* | 9/2008 | Lee et al. ..................... 438/106 |
| 2004/0238881 A1 | 12/2004 | Ozawa |
| 2006/0001076 A1* | 1/2006 | Ozawa ......................... 257/315 |
| 2006/0060927 A1* | 3/2006 | Ozawa et al. ................ 257/390 |
| 2006/0240619 A1 | 10/2006 | Ozawa et al. |

FOREIGN PATENT DOCUMENTS

| JP | 2005-26590 | 1/2005 |
| KR | 10-2004-0002818 | 1/2004 |
| KR | 10-2005-0004109 | 1/2005 |
| KR | 10-2005-0051480 | * 6/2005 |

OTHER PUBLICATIONS

Notification for Filing Opinion mailed Aug. 22, 2008, for co-pending Korean App. No. 10-2007-36546 and English translation thereof.

* cited by examiner

*Primary Examiner*—Evan Pert
*Assistant Examiner*—William Harriston
(74) *Attorney, Agent, or Firm*—Finnegan, Henderson, Farabow, Garrett & Dunner, L.L.P.

(57) ABSTRACT

A semiconductor device includes a semiconductor substrate, a plurality of nonvolatile memory cells provided on the semiconductor substrate, each of the plurality of nonvolatile memory cells comprising a first insulating film provided on the semiconductor substrate, a charge storage layer provided on the first insulating film, a control gate electrode provided above the charge storage layer, a second insulating film provided between the control gate electrode and the charge storage layer, the second insulating film between adjacent charge storage layers including a first region having permittivity lower than that of the second insulating film on a top surface of the charge storage layer in a cross-section view of a channel width direction of the nonvolatile memory cell, and the first region having composition differing from that of the second insulating film on the top surface of the charge storage layer.

12 Claims, 12 Drawing Sheets

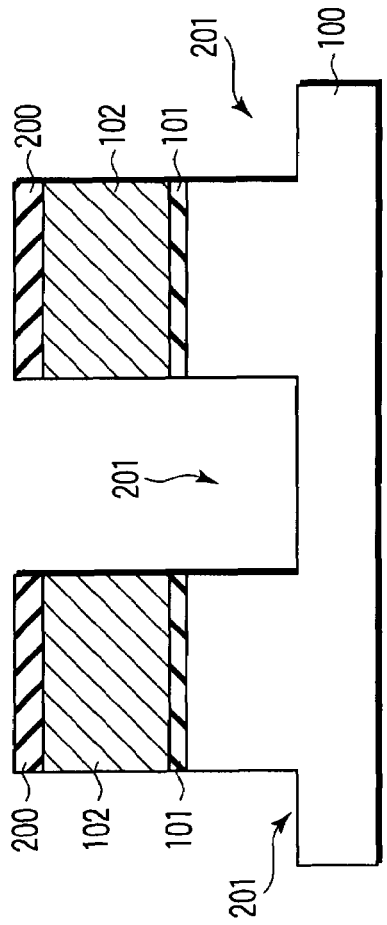
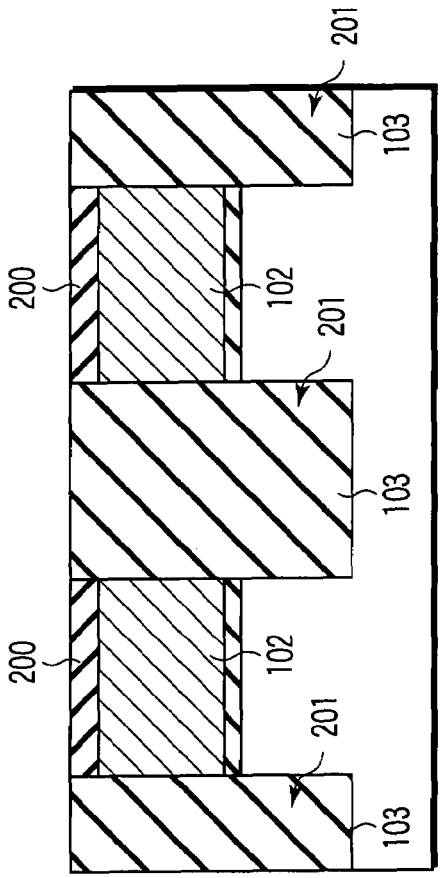
FIG. 3A
FIG. 3B
FIG. 4A
FIG. 4B

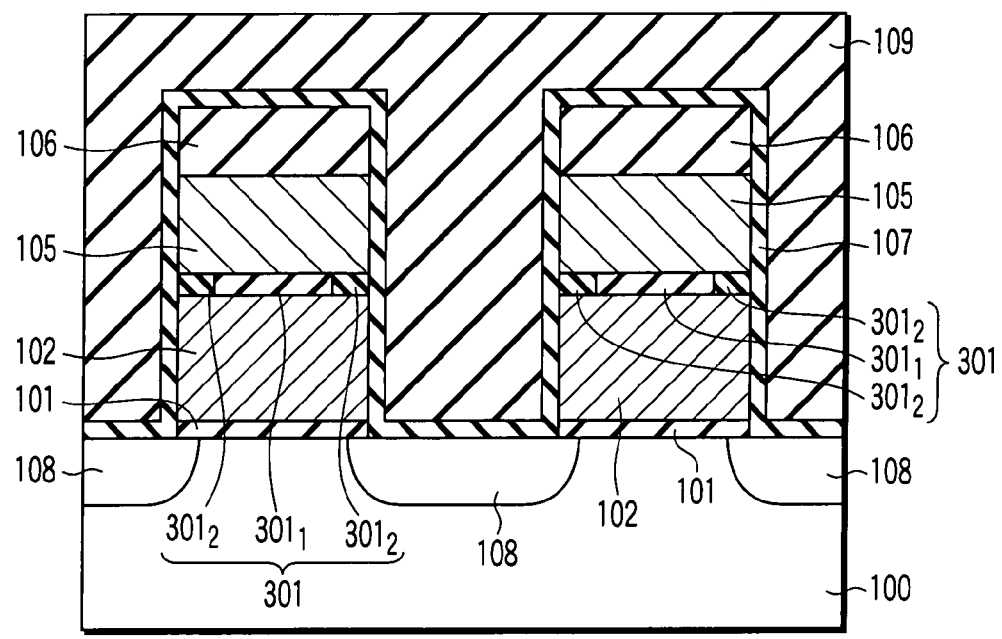
F I G. 22
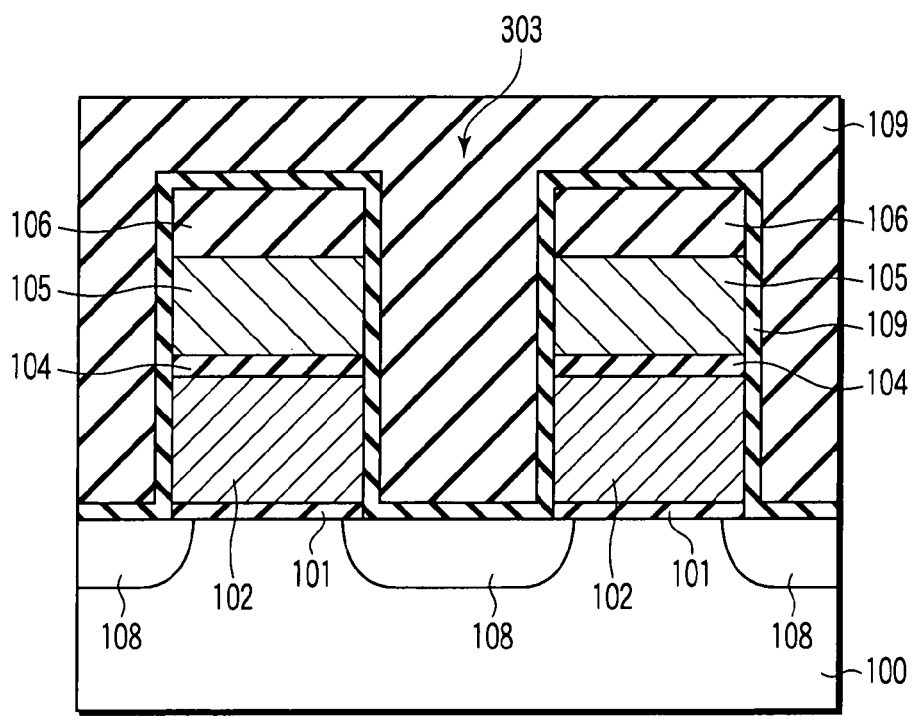
F I G. 23

SEMICONDUCTOR DEVICE

CROSS-REFERENCE TO RELATED APPLICATIONS

This application is based upon and claims the benefit of priority from prior Japanese Patent Application No. 2006-112191, filed Apr. 14, 2006, the entire contents of which are incorporated herein by reference.

BACKGROUND OF THE INVENTION

1. Field of the Invention

The present invention relates to a semiconductor device comprising an electrically-rewritable nonvolatile memory cell.

2. Description of the Related Art

A nonvolatile semiconductor memory is exemplified as one of semiconductor memory devices. In recent years, there has been a growing demand for the nonvolatile semiconductor memory used as a data storage device. A NAND-type flash memory is known as a typical electrically-rewritable nonvolatile semiconductor memory using floating gate electrodes.

The NAND-type flash memory is advantageous in downsizing, and thus, increasing its memory density is underway (Jpn. Pat. Appln. KOKAI Publication No. 2005-26590). Currently, dimensions of the memory cell and adjacent memory cells distance have reached 100 nm or less.

A shape of the floating gate electrode gradually becomes vertically long with a dimension decrease in the lateral direction, because coupling ratio of the memory cell should be maintained at a desired value. Therefore, process for forming memory cell shape is getting difficult, and thereby variation of operation characteristics easily arises. Further, parasitic capacitance of the adjacent memory cells increases. Above-mentioned the variation of operation characteristics and the increasing of parasitic capacitance cause memory malfunction.

BRIEF SUMMARY OF THE INVENTION

According to an aspect of the present invention, there is provided a semiconductor device comprising: a semiconductor substrate; a plurality of nonvolatile memory cells provided on the semiconductor substrate, each of the plurality of nonvolatile memory cells comprising: a first insulating film provided on the semiconductor substrate, a charge storage layer provided on the first insulating film, a control gate electrode provided above the charge storage layer, a second insulating film provided between the control gate electrode and the charge storage layer, the second insulating film between adjacent charge storage layers including a first region having permittivity lower than that of the second insulating film on a top surface of the charge storage layer in a cross-section view of a channel width direction of the nonvolatile memory cell, and the first region having composition differing from that of the second insulating film on the top surface of the charge storage layer.

According to another aspect of the present invention, there is provided a semiconductor device comprising: a semiconductor substrate; a plurality of nonvolatile memory cells provided on the semiconductor substrate, each of the plurality of nonvolatile memory cells comprising: a first insulating film provided on the semiconductor substrate, a charge storage layer provided on the first insulating film, a control gate electrode provided above the charge storage layer, a second insulating film including metal oxide and provided between the control gate electrode and the charge storage layer, the second insulating film between adjacent charge storage layers including a first region comprising metal oxide having oxygen composition ratio higher than that of the second insulating film on a top surface of the charge storage layer in a cross-section view of a channel width direction of the nonvolatile memory cell.

According to another aspect of the present invention, there is provided a semiconductor device comprising: a semiconductor substrate; a plurality of nonvolatile memory cells provided on the semiconductor substrate, each of the plurality of nonvolatile memory cells comprising: a first insulating film provided on the semiconductor substrate, a charge storage layer provided on the first insulating film, a control gate electrode provided above the charge storage layer, a second insulating film including metal oxide and provided between the control gate electrode and the charge storage layer, the second insulating film between an edge portion of the charge storage layer and an edge portion of the control gate electrode including a region having oxygen concentration higher than that of the second insulating film between a central portion of the charge storage layer and a central portion of the control gate electrode in a cross-section view of a channel length direction of the nonvolatile memory cell.

According to another aspect of the present invention, there is provided a semiconductor device comprising: a semiconductor substrate; a plurality of nonvolatile memory cells provided on the semiconductor substrate, each of the plurality of nonvolatile memory cells comprising: a first insulating film provided on the semiconductor substrate, a charge storage layer provided on the first insulating film, a control gate electrode provided above the charge storage layer, a second insulating film including metal oxide comprising two or more kinds of metals and provided between the control gate electrode and the charge storage layer, the second insulating film between an edge portion of the charge storage layer and an edge portion of the control gate electrode including a region having charge trap state density lower than that of the second insulating film between a central portion of the charge storage layer and a central portion of the control gate electrode in a cross-section view of a channel length direction of the nonvolatile memory cell.

BRIEF DESCRIPTION OF THE SEVERAL VIEWS OF THE DRAWING

FIGS. 3A and 3B are cross-section views showing a first method for manufacturing the nonvolatile memory cell of the first embodiment;

FIGS. 4A and 4B are cross-section views showing the first method for manufacturing the nonvolatile memory cell of the first embodiment following FIGS. 3A and 3B;

FIG. 22 a cross-section view in a word line direction (channel width direction) showing a nonvolatile memory cell according to a third embodiment;

FIG. 23 is a cross-section view showing a first method for manufacturing the nonvolatile memory cell of the third embodiment;

DETAILED DESCRIPTION OF THE INVENTION

Embodiments of the invention will be described below with reference to the drawings.

First Embodiment

Figure 1:
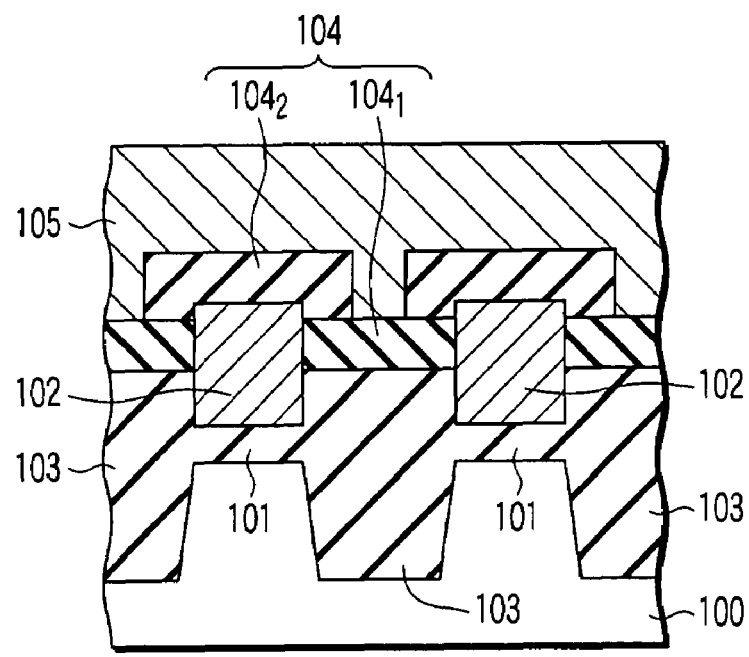
FIG. 1 is a cross-section view in a word line direction (channel width direction) showing a first nonvolatile memory cell according to a first embodiment.
Figure 2:
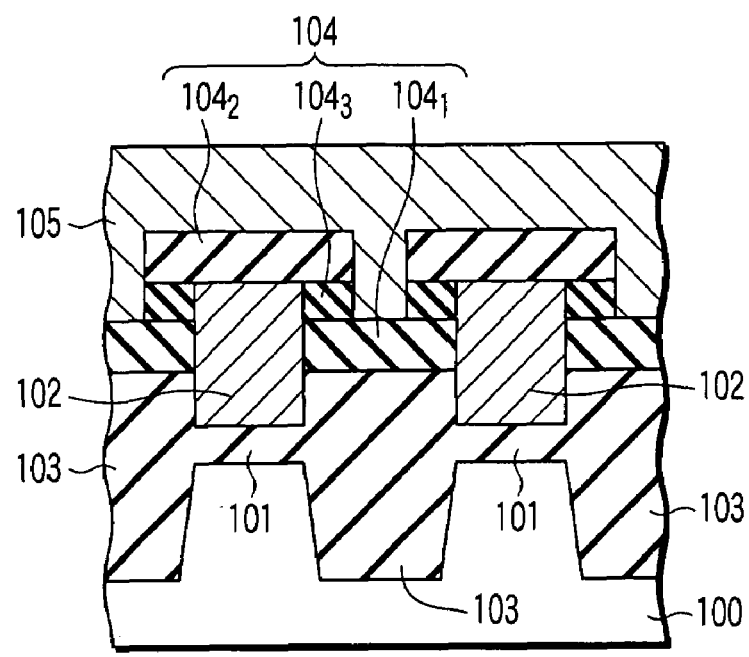
FIG. 2 is a cross-section view in a word line direction (channel width direction) showing a second nonvolatile memory cell according to a first embodiment.

FIGS. 1 and 2 cross-section views showing first and second nonvolatile memory cells according to a first embodiment, the sections being taken in a word line direction (channel width direction). Referring to FIGS. 1 and 2, the numeral 100 designates a semiconductor substrate, the numeral 101 designates a tunnel insulating film, the numeral 102 designates a floating gate electrode, the numeral 103 designates an isolation insulating film for STI (Shallow Trench Isolation), the numeral 104 ($104_1$, $104_2$, and $104_3$) designates an inter-gate electrode insulating film (hereinafter simply referred to as interelectrode insulating film), and the numeral 105 designates a control gate electrode.

The interelectrode insulating film 104 of FIG. 1 includes the first interelectrode insulating film $104_1$ and the second interelectrode insulating film $104_2$. The first interelectrode insulating film $104_1$ is provided in an area between the adjacent floating gate electrodes 102. The second interelectrode insulating film $104_2$ is provided on another area (here, a top surface and an upper side face of the floating gate electrode 102).

A permittivity $\epsilon 1$ of the first interelectrode insulating film $104_1$ is lower than a permittivity $\epsilon 2$ of the second interelectrode insulating film $104_2$. For example, a magnitude relation ($\epsilon 1 < \epsilon 2$) between the permittivities is realized by changing compositions or phases of the first and second interelectrode insulating films $104_1$ and $104_2$. Here, the composition means a group of components (such as elements and compounds) constituting a target substance and a quantitative relation thereof. Specifically, an additional element or an element (composition element) of a main component of the first and second interelectrode insulating films $104_1$ and $104_2$ is changed to realized the magnitude relation ($\epsilon 1 < \epsilon 2$). The phase shall mean a substance state which is defined by a chemical bonding force, bond length, and bond angle between the components constituting the substance.

Examples of the changing of additional element is to add an element causing low permittivity into the first interelectrode insulating film $104_1$ (for example, addition of a silicon element into an interelectrode insulating film containing alumina), or to add an element causing high permittivity into the second interelectrode insulating film $104_2$ (for example, addition of a hafnium element into the interelectrode insulating film containing alumina).

An examples of the changing of composition element is to use a multi-metal oxide including metal elements as the interelectrode insulating film 104 such that the first interelectrode insulating film $104_1$ is lower than the second interelectrode insulating film $104_2$ in permittivity (for example, in the case of the interelectrode insulating film containing hafnium aluminate, aluminum content of the first interelectrode insulating film $104_1$ is increased while a hafnium content is decreased).

Incidentally, as described above, when the dimension in the lateral direction is decreased while the coupling ratio is maintained at the desired value, the process for forming the memory cell shape becomes difficult as the shape of the floating gate electrode becomes gradually vertically long, which increases the variation in operating characteristics and the adjacent memory cells parasitic capacitance.

Figure 27:
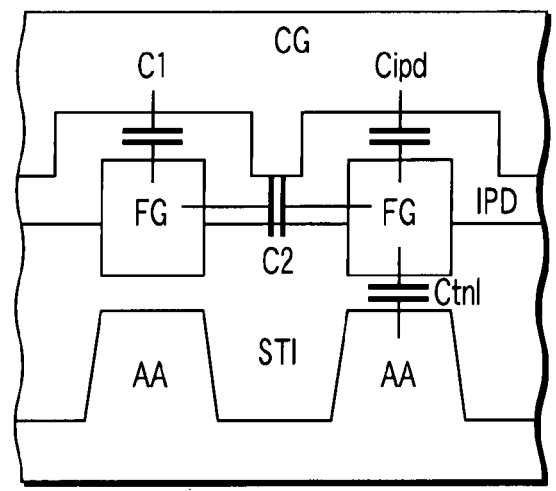
FIG. 27 is a view for explaining a problem revealed through the study conducted by the present inventors.

The inventors have thought of using a high-permittivity insulating material as the interelectrode insulating film in order to solve the above problems. However, when the permittivity of the interelectrode insulating film is increased, a physical film thickness becomes thick in order to obtain a desired electric capacitance. Therefore, according to the study of the inventors, as shown in FIG. 27, when a desired electric capacitance (interelectrode insulating film capacitance) C1 is ensured between a floating gate electrode FG and a control gate electrode CG, a parasitic electric capacitance C2 is increased between the adjacent floating gate electrodes FG, and thereby the memory malfunction caused by the interference between the adjacent cells cannot be avoided. In FIG. 27, the letters AA designates an active area (semiconductor substrate), the letters STI designates an isolation insulating film for isolation by shallow trench, and the letters IPD designates an interelectrode insulating film.

On the other hand, when the interelectrode insulating film 104 ($104_1$ and $104_2$) of the first embodiment having the relatively low permittivity between the adjacent floating gate electrodes 102 is used, the parasitic capacitance can be decreased between the adjacent floating gate electrodes 102 while the interelectrode insulating film capacitance C1 is ensured. Thereby, the memory malfunction caused by the interference between the adjacent cells can be avoided, even if the dimension in the lateral direction is decreased while the coupling ratio is maintained at the desired value. The coupling ratio is given by Cipd/(Ctnl+Cipd) using the capacitances Cipd and Ctnl shown in FIG. 27.

In addition, the physical film thickness of the interelectrode insulating film $104_1$ on the side face of the floating gate electrode 102 can be thinned by decreasing the permittivity of the interelectrode insulating film $104_1$ on the side face of the floating gate electrode 102. Thereby, depth of a trench formed by the interelectrode insulating film 104 between the adjacent memory cells is deepened, the control gate electrode 105 having the sufficient length fills the deepened trench, and hence the parasitic capacitance is reduced by shielding effect of electric flux lines.

The interelectrode insulating film 104 of FIG. 2 comprises the first interelectrode insulating film $104_1$, the second interelectrode insulating film $104_2$, and the third interelectrode insulating film $104_3$. The first interelectrode insulating film $104_1$ is provided in an area between the adjacent floating gate electrodes 102. The second interelectrode insulating film $104_2$ is provided on the top surface of the floating gate electrode 102 and on the periphery thereof. The third interelectrode insulating film $104_3$ is provided on another area (here, the upper side face of the floating gate electrode 102). In other words, the third interelectrode insulating film $104_3$ is provided on the side face of the floating gate electrode 102 between the first interelectrode insulating film $104_1$ and the second interelectrode insulating film $104_2$.

The permittivity $\epsilon 1$ of the first interelectrode insulating film $104_1$ is lower than the permittivity $\epsilon 2$ of the second interelectrode insulating film $104_2$, and a permittivity $\epsilon 3$ of the third interelectrode insulating film $104_3$ is higher than the permittivity $\epsilon 1$ and lower than the permittivity $\epsilon 2$ ($\epsilon 1 < \epsilon 3 < \epsilon 2$). Thereby, the parasitic capacitance caused by wraparound of the electric flux lines is further decreased between the floating gate electrodes 102, and hence the shielding effect becomes remarkably larger.

The physical film thickness of the interelectrode insulating film $104_1$ and $104_3$ on the side face of the floating gate electrode 102 can be thinned by decreasing the permittivities of the interelectrode insulating film $104_1$ and $104_3$ on the side face of the floating gate electrode 102. Thereby, width of a trench formed by the interelectrode insulating film 104 between the adjacent memory cells is widened, the control gate electrode 105 having the sufficient length fills the deepened trench, and hence the parasitic capacitance is reduced by shielding effect of electric flux lines.

In addition, in FIGS. 1 and 2, the example of the single-layer interelectrode insulating film is shown, the effect of the embodiment can also be obtained in the case of a multi-layer interelectrode insulating film in which insulating films made of different materials are laminated. Particularly, in a case where a lower side portion of the multi-layer interelectrode insulating film is a high permittivity insulating film, the embodiment can effectively be applied to the lower layer side portion.

In addition, in FIGS. 1 and 2, the whole of the interelectrode insulating film between the adjacent floating gate electrodes has the permittivity lower than that of the interelectrode insulating film on the top surface of the floating gate electrode, however, the effect of the embodiment can also be obtained in a case where a part of the interelectrode insulating film between the adjacent floating gate electrodes has the permittivity lower than that of the interelectrode insulating film on the top surface of the floating gate electrode. Further, the effect of the embodiment can also be obtained in a case where a part of the interelectrode insulating film except between the adjacent floating gate electrodes has the lower permittivity.

Next, a first method for manufacturing the nonvolatile memory cell (FIG. 1) of the embodiment will be described with reference to FIGS. 3A and 3B to FIGS. 9A and 9B. In FIGS. 3A and 3B to FIGS. 9A and 9B, the left side is a cross-section view in a bit-line direction (channel length direction), and the right side is a cross-section view in the word line direction (channel width direction).

First, as shown in FIGS. 3A and 3B, the tunnel insulating film (here, tunnel oxide film) 101 having a thickness of 6 nm is formed by thermal oxidation method on the surface of the semiconductor substrate (here, silicon substrate) 100 into which desired impurities are doped, thereafter, the phosphorous-doped polycrystalline silicon layer 102 having the thickness of 100 nm to be the floating gate electrode and a mask material 200 for processing the isolation are sequentially deposited by CVD (Chemical Vapor Deposition) method. Next, the mask material 200, the polycrystalline silicon layer 102, and the tunnel insulating film 101 are sequentially etched by RIE (Reactive Ion Etching) method using a first resist mask (not shown), and further an exposed area of the semiconductor substrate 100 is etched to make an isolation trench 201 having the depth of 100 nm. At this time, the widths of the isolation trench 201 and the polycrystalline silicon layer 102 are set to about 50 nm.

Next, as shown in FIGS. 4A and 4B, the isolation insulating film (here, silicon oxide film) 103 is deposited on the whole surface to completely fill the isolation trench 201, thereafter, the isolation insulating film 103 on the surface portion is removed by CMP (Chemical Mechanical Polish) method, and hence the surface is planarized. At this time, the mask material 200 is exposed.

Figure 5A:
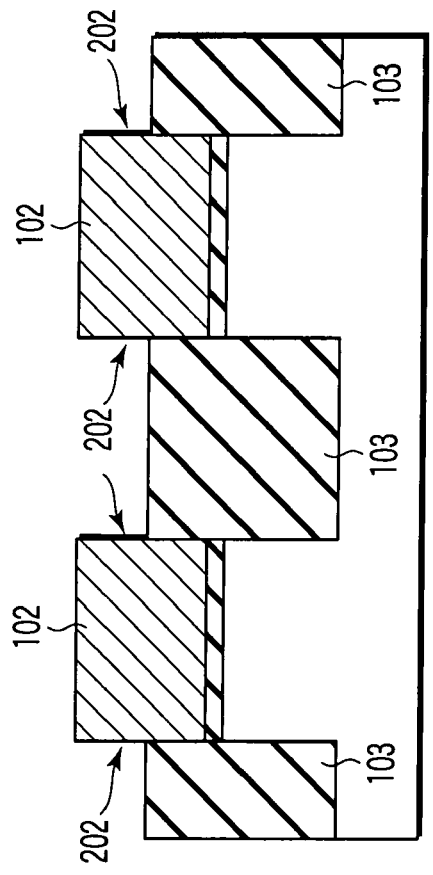
FIGS. 5A and 5B are cross-section views showing the first method for manufacturing the nonvolatile memory cell of the first embodiment following FIGS. 4A and 4B.
Figure 5B:
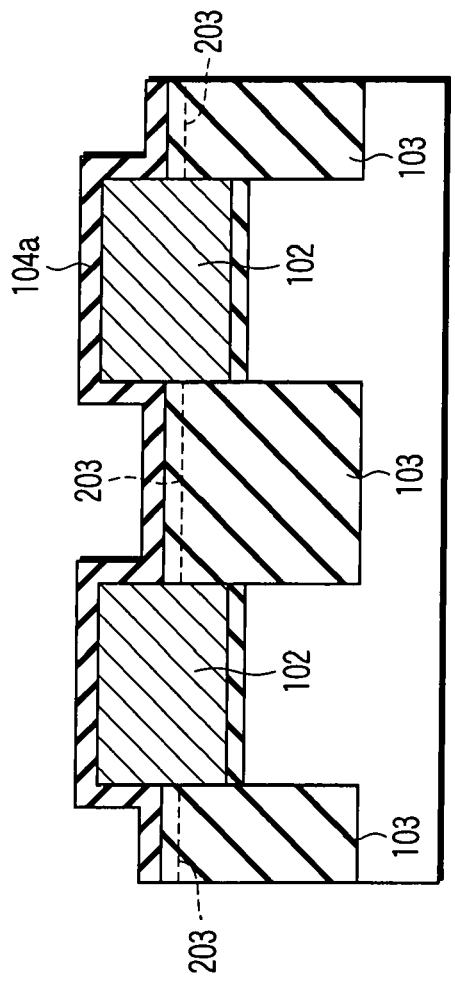

Next, as shown in FIGS. 5A and 5B, the exposed mask material 200 is selectively etched and removed by chemical solution, and further the exposed surface of the isolation insulating film 103 is etched and removed by dilute hydrofluoric acid solution, and hence the sidewall surface 202 of the polycrystalline silicon layer 102 is exposed. A height of the sidewall surface 202 is set to 50 nm.

Figure 6A:
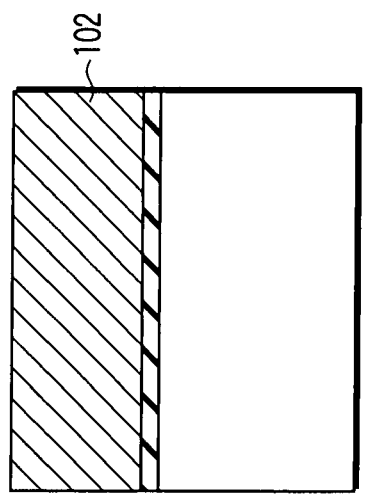
FIGS. 6A and 6B are cross-section views showing the first method for manufacturing the nonvolatile memory cell of the first embodiment following FIGS. 5A and 5B.
Figure 6B:
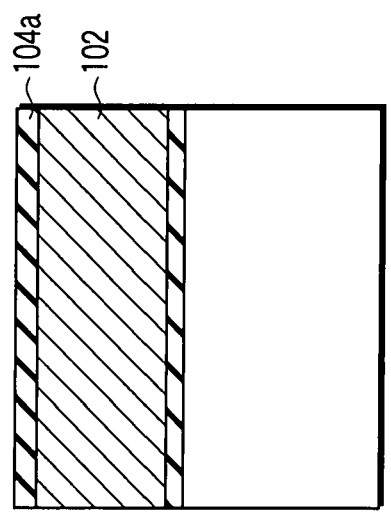

Next as shown in FIGS. 6A and 6B, the whole of the substrate is dipped in aluminum nitric acid solution to cause an aluminum element to penetrate in 10 nm thickness of surface portion of the isolation insulating film 103 with a concentration of $1\times10^{15}$ atoms/cm$^{-2}$. Next, moisture in the isolation insulating film 103 is vaporized by heating process, thereafter, a hafnia film 104a having the thickness of 20 nm to be the interelectrode insulating film is deposited on the entire surface by CVD method.

Figure 7A:
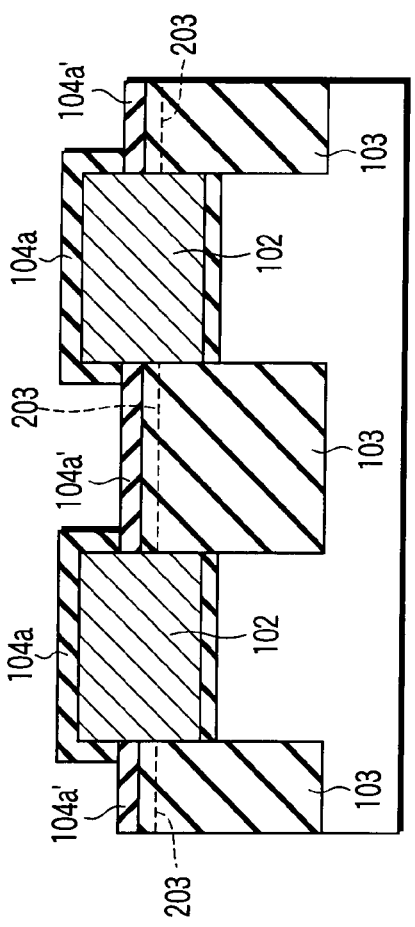
FIGS. 7A and 7B are cross-section views showing the first method for manufacturing the nonvolatile memory cell of the first embodiment following FIGS. 6A and 6B.
Figure 7B:
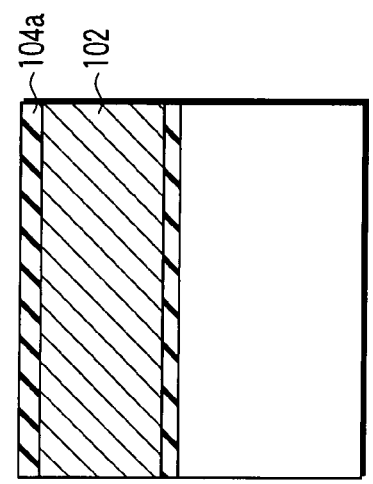

Next, as shown in FIGS. 7A and 7B, oxidizing atmosphere annealing is performed at a temperature of about 900° C. to thermally diffuse the aluminum element into the hafnia film 104a between the adjacent floating gate electrodes 102, and the hafnia film 104a between the adjacent floating gate electrodes 102 is converted into a hafnium aluminate film 104a'. The hafnium aluminate film 104a' corresponds to the first interelectrode insulating film $104_1$ of FIG. 1, and the hafnia film 104a corresponds to the second interelectrode insulating film $104_2$ of FIG. 1.

Figure 8A:
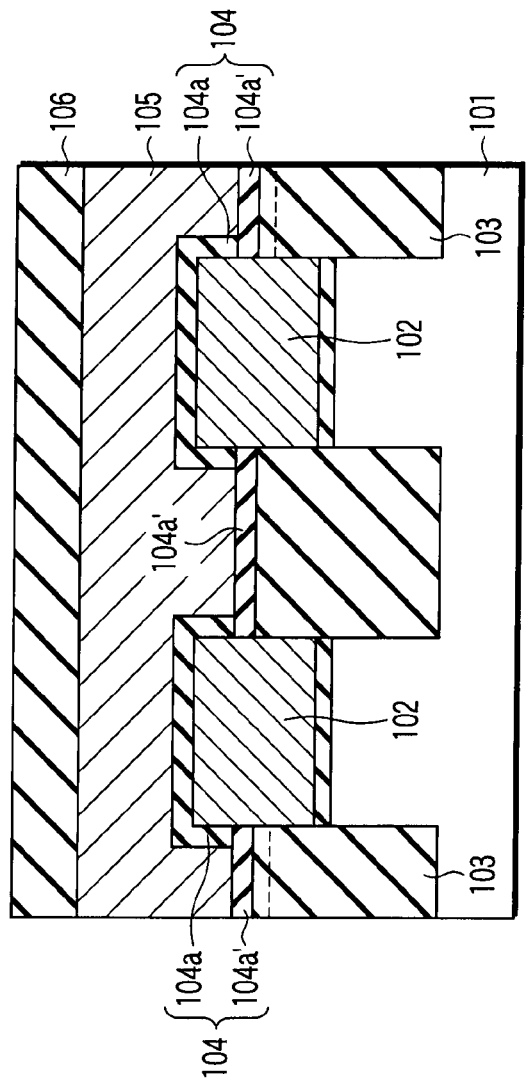
FIGS. 8A and 8B are cross-section views showing the first method for manufacturing the nonvolatile memory cell of the first embodiment following FIGS. 7A and 7B.
Figure 8B:
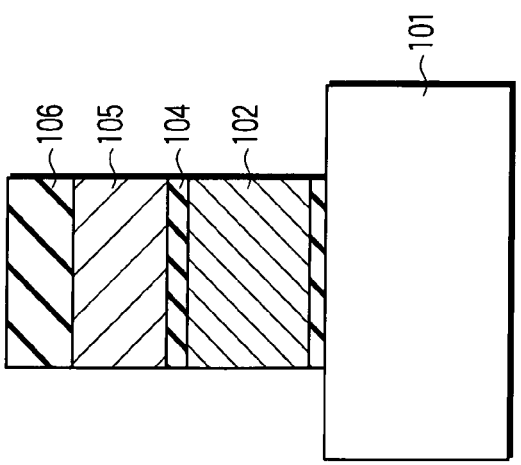

Next, as shown in FIGS. 8A and 8B, the conductive layer 105 to be the control gate electrode is formed. Here, a double-layer-structure conductive layer having the thickness of 100 nm and comprising a polycrystalline silicon layer and a tungsten silicide layer is used as the conductive layer 105. The polycrystalline silicon layer and the tungsten silicide layer are sequentially formed, for example, by CVD method. Next, a silicon nitride film 106 to be the mask material of RIE is formed on the conductive layer 105 by CVD method, thereafter, the silicon nitride film (mask material) 106, the conductive layer 105, the interelectrode insulating film 104 (104a and 104a'), the polycrystalline silicon layer 102 and the tunnel insulating film 101 are sequentially etched to form the floating gate electrode 102 and the control gate electrode 105 by RIE method using a second resist mask (not shown) having a pattern orthogonal to the first resist mask. At this time, the width of the floating gate electrode 102 and a space between the floating gate electrodes 102 are set to about 50 nm.

Figure 9B:
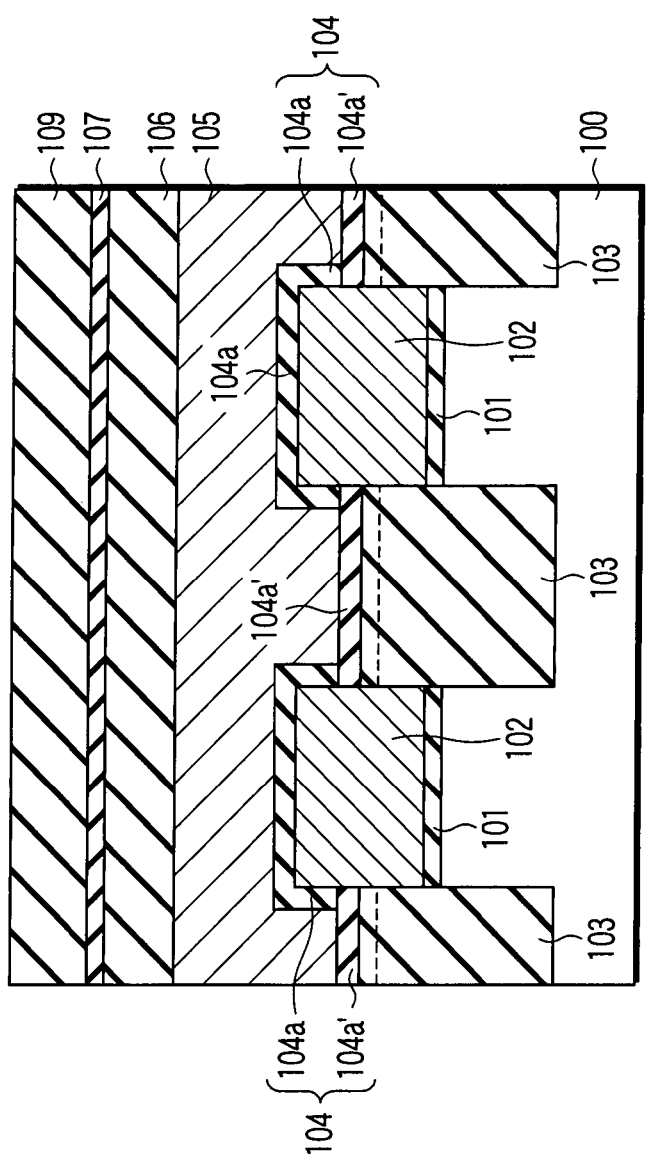
FIGS. 9A and 9B are cross-section views showing the first method for manufacturing the nonvolatile memory cell of the first embodiment following FIGS. 8A and 8B.
Figure 9A:
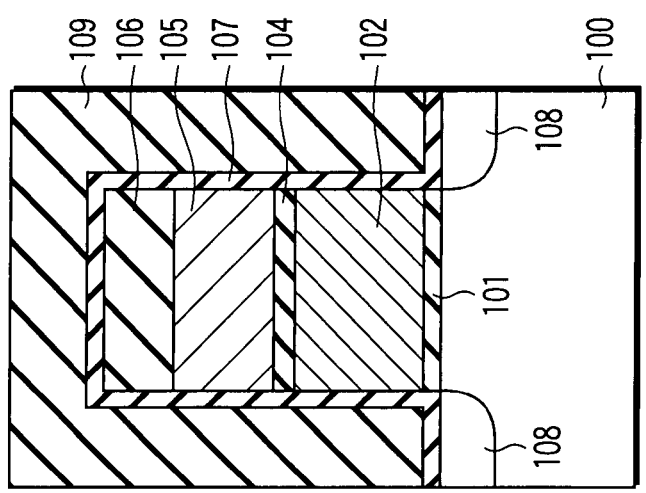

Next, as shown in FIGS. 9A and 9B, a gate sidewall oxide film 107 having the thickness of about 10 nm is formed on the sidewalls of the floating gate electrode 102 and control gate electrode 105 by combination of thermal oxidation method and CVD method, thereafter, ion implantation and annealing are performed to form an impurity diffusion layers (source/drain areas) 108. Next, an interlayer insulating film 109 is formed by CVD method or the like, and further interconnection or the like (not shown) are formed to complete the nonvolatile memory cell by using known techniques.

By the first manufacturing method, the interelectrode insulating film 104 in which the interelectrode insulating film 104a' between the adjacent floating gate electrodes 102 has lower permittivity than other part of the interelectrode insulating film 104a is realized.

In addition, in the present manufacturing method, the supply source of the element causing the low permittivity is formed by dipping in the solution, certainly, another method may be adopted. Moreover, the introducing of the element into the interelectrode insulating for lowering the permittivity is not limited to the thermal diffusion. Further, in the manufacturing method, the aluminum element is introduced into the hafnia film, however, as long as $\epsilon1<\epsilon2$ is realized, the same effect is obtained by introducing another element or by the combination of another film and another element.

Figure 10:
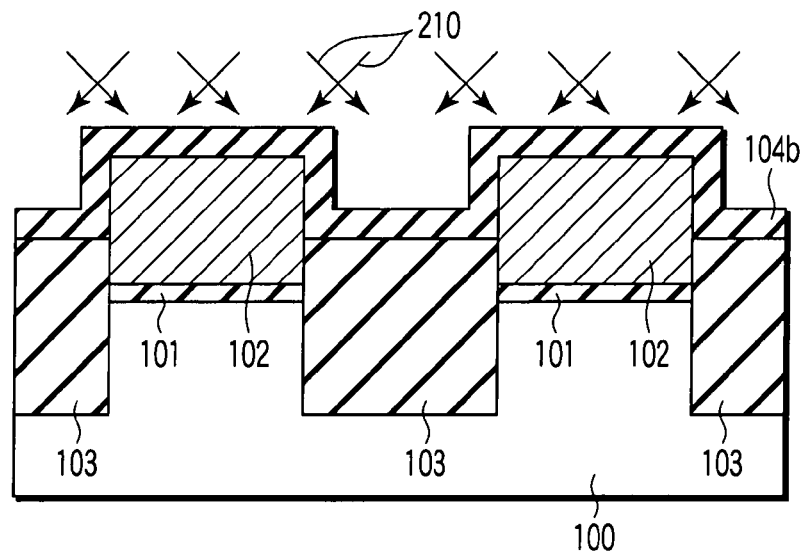
FIG. 10 is a cross-section view showing a second method for manufacturing the nonvolatile memory cell of the first embodiment.
Figure 11:
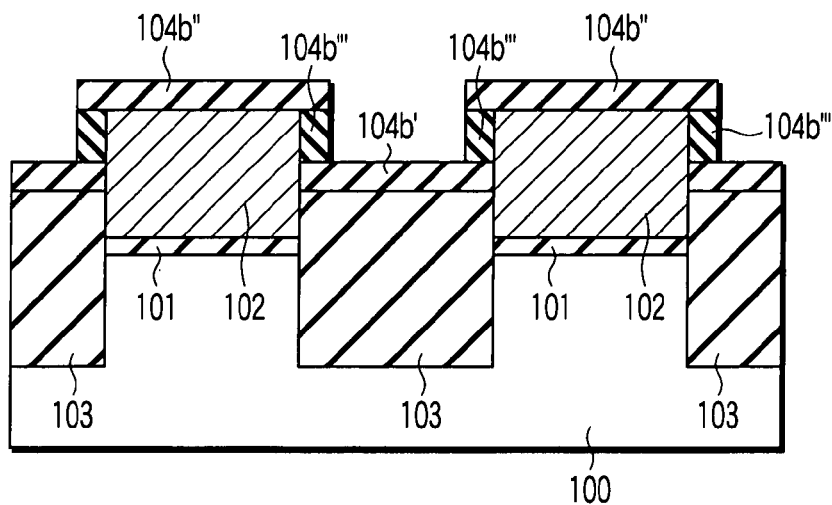
FIG. 11 is a cross-section view showing the second method for manufacturing the nonvolatile memory cell of the first embodiment following FIG. 10.

FIGS. 10 and 11 show cross-section views showing a second manufacturing method. FIGS. 10 and 11 correspond to cross-section views shown on the right sides of FIGS. 6A and 6B and FIGS. 7A and 7B in the first manufacturing method.

First, as the first manufacturing method, the processes from FIGS. 3A and 3B to FIGS. 5A and 5B are performed.

Next, as shown in FIG. 10, a silicon oxynitride film 104b having the thickness of 10 nm to be the interelectrode insulating film is deposited on the entire surface by CVD method. Next, the ion implantation of an aluminum element 210 is performed over the entire surface under the conditions of an incident angle of about 30° and a dosage of about $1\times10^{15}$ atoms/cm$^2$ to introduce the aluminum element into the silicon oxynitride film 104b on the top surface of the floating gate electrode 102, into the silicon oxynitride film 104b on the side face of the floating gate electrode 102, and into the silicon oxynitride film 104b between the adjacent floating gate electrodes 102.

Next, as shown in FIG. 11, the oxidizing atmosphere annealing is performed at 900° C. to convert the silicon oxynitride film 104b into a nitrogen-contained aluminum silicate films 104b', 104b'', and 104b'''. The nitrogen-contained aluminum silicate films 104b', 104b'', and 104b''' correspond to the interelectrode insulating film $104_1$, $104_2$, and $104_3$ of FIG. 2 respectively. Thereafter, as the first manufacturing method, the nonvolatile memory cell is completed by using known techniques.

By the second manufacturing method, the permittivity of the interelectrode insulating film is changed according to the aluminum content of the silicon oxynitride film 104b. That is, the nitrogen-contained aluminum silicate film 104'' on the top surface of the floating gate electrode 102 has the highest permittivity, the nitrogen-contained aluminum silicate film 104''' on the upper side face of the floating gate electrode 102 has the second highest permittivity, and the nitrogen-contained aluminum silicate film 104' between the adjacent floating gate electrodes 102 has the lowest permittivity.

In addition, in the second manufacturing method, the element causing the high permittivity is introduced by oblique ion implantation, certainly, another method may be adopted. Moreover, in the second manufacturing method, the element causing the high permittivity is introduced after the interelectrode insulating film is formed, however, the element causing the high permittivity may be introduced during the deposition of the interelectrode insulating film. Further, in the second manufacturing method, the aluminum element is introduced into the silicon oxynitride film, however, as long as $\epsilon1<\epsilon3<\epsilon2$ is realized, the same effect is obtained by introducing another element or by the combination of another film and another element.

Figure 12:
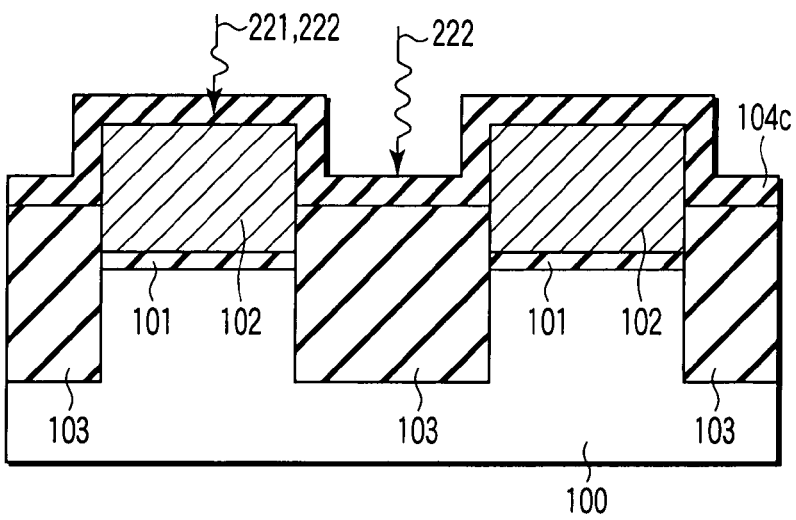
FIG. 12 is a cross-section view showing a third method for manufacturing the nonvolatile memory cell of the first embodiment.
Figure 13:
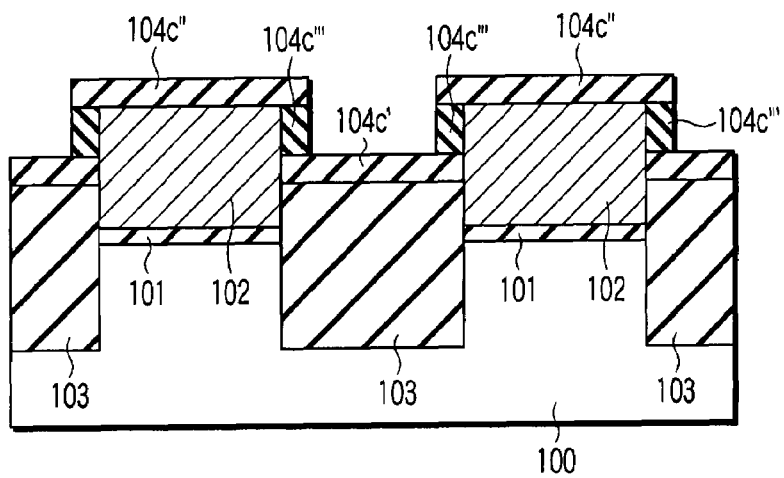
FIG. 13 is a cross-section view showing the third method for manufacturing the nonvolatile memory cell of the first embodiment following FIG. 12.

FIGS. 12 and 13 show cross-section views showing a third manufacturing method. FIGS. 12 and 13 correspond to the cross-section views shown on the right sides of FIGS. 6A and 6B and FIGS. 7A and 7B in the first manufacturing method.

First, as the first manufacturing method, the processes from FIGS. 3A and 3B to FIGS. 5A and 5B are performed.

Next, as shown in FIG. 12, a hafnium aluminate film 104c having the thickness of 20 nm to be the interelectrode insulating film is deposited on the entire surface by ALD (Atomic Layer Deposition) method. A macromolecular tetrakisethyl methyl amino hafnium (macromolecular source gas) 221 and a low-molecular trimethyl aluminum (low-molecular source gas) 222 are used as a metal source gas, and moisture is used as an oxygen source gas. At this time, as the macromolecular source gas 221 hardly enters the area between the adjacent floating gate electrodes 102, the supply of the macromolecular source gas 221 to the area is suppressed.

Next, as shown in FIG. 13, the hafnium aluminate film 104c is densified to convert the hafnium aluminate film 104c into high-quality hafnium aluminate films 104c', 104c'', and 104c''' by heating process at about 900° C. The hafnium aluminate films 104c', 104c'', and 104c''' correspond to the interelectrode insulating film $104_1$, $104_2$, and $104_3$ of FIG. 2 respectively. Thereafter, as the first manufacturing method, the nonvolatile memory cell is completed by using known techniques.

By the third manufacturing method, the permittivity of the interelectrode insulating film is changed according to the hafnium content of the hafnium aluminate film 104*c*. That is, the hafnium aluminate film 104*c″* on the top surface of the floating gate electrode has the highest permittivity, the hafnium aluminate film 104*c‴* on the side face of the floating gate electrode has the second highest permittivity, and the hafnium aluminate film 104*c′* between the adjacent floating gate electrodes has the lowest permittivity.

In addition, in the present manufacturing method, the interelectrode insulating film is deposited by ALD method, certainly, another method may be adopted. Moreover, in the present manufacturing method, the hafnium aluminate film is described as an example, however, the combination with another source gas (metal) may be adopted, the same effect is obtained when a low-molecular source gas is selected as the source gas of the metal causing the low permittivity and a macromolecular source gas is selected as the source gas of the metal causing the high permittivity. Further, the present method can also be applied to the case of at least three kinds of the metal elements. The same effect is obtained irrespective of a molecular weight when a source gas having different transportation efficiency in a gas phase is used.

Second Embodiment

Figure 14:
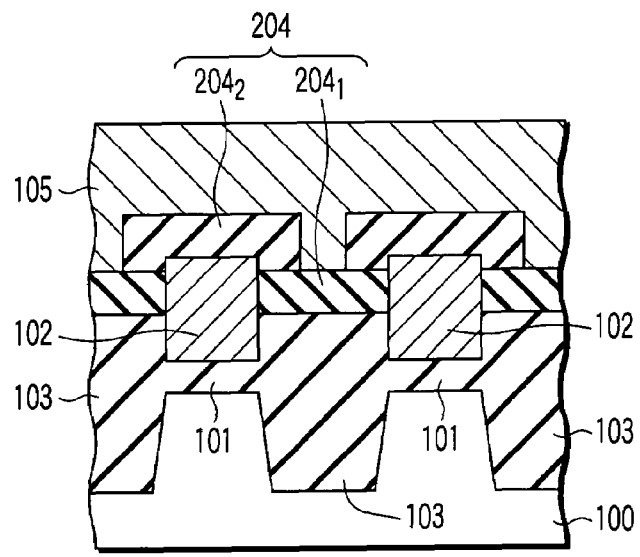
FIG. 14 a cross-section view in a word line direction (channel width direction) showing a first nonvolatile memory cell according to a second embodiment.
Figure 15:
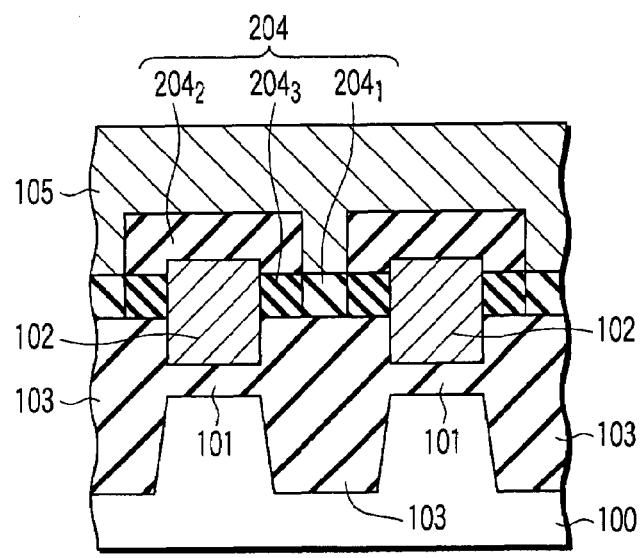
FIG. 15 a cross-section view in a word line direction (channel width direction) showing a second nonvolatile memory cell according to a second embodiment.

FIGS. 14 and 15 are cross-section views showing first and second nonvolatile memory cells according to a second embodiment, the sections being taken in the word line direction (channel width direction). The same numeral as the first embodiment designates the same component, and the detailed description is not repeated.

An interelectrode insulating film 204 of FIG. 14 includes first and second interelectrode insulating films 204$_1$ and 204$_2$ including metal oxide. The first interelectrode insulating film 204$_1$ is provided in an area between the adjacent floating gate electrodes 102. The second interelectrode insulating film 204$_2$ is provided on another area (here, the top surface and upper side face of the floating gate electrode 102).

An oxygen composition ratio r1 of the first interelectrode insulating film 204$_1$ is higher than an oxygen composition ratio r2 of the second interelectrode insulating film 204$_2$. For example, a magnitude relation (r1>r2) between the oxygen composition ratios is realized by supplying the oxygen into a metal oxide film between the adjacent floating gate electrodes 102 after the metal oxide film to be the interelectrode insulating film is deposited or by supplying the metal into the metal oxide film on the top surface and upper side face of the floating gate electrode 102. Alternatively, the magnitude relation (r1>r2) between the oxygen composition ratios is realized by decreasing a metal composition of the metal oxide film between the adjacent floating gate electrodes 102 or by decreasing an oxygen concentration of the metal oxide film on the top surface and upper side face of the floating gate electrode 102.

Figure 28:
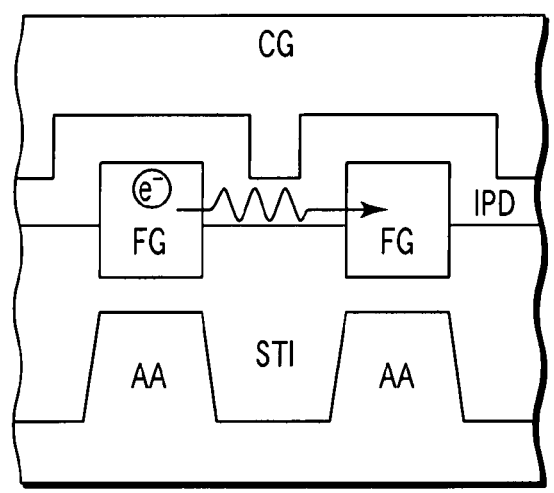
FIG. 28 is a view for explaining another problem revealed through the study conducted by the present inventors.

Incidentally, in the high-permittivity insulating material, charge transfer possibly caused by hopping conduction is easily generated in the insulating material even in the weak applied electric field. Therefore, according to the study of the inventors, in the case where the high-permittivity insulating material is used as the interelectrode insulating film as shown in FIG. 28, the charge (electron in FIG. 28) is moved between the adjacent floating gate electrodes to decrease charge retaining property of the memory cell, which results in the generation of the memory malfunction.

Figure 29:
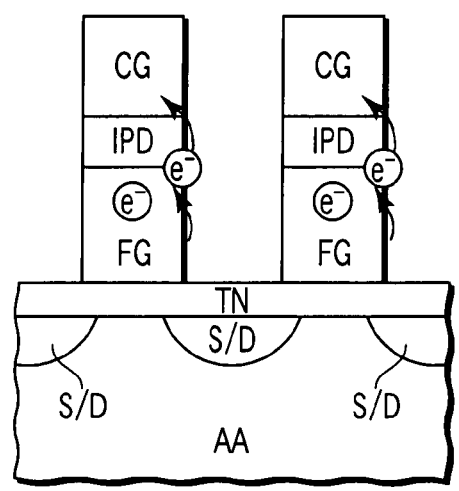
FIG. 29 is a view for explaining still another problem revealed through the study conducted by the present inventors.

In addition, capture/emission (so-called trapping/detrapping) of the charge is easily generated in the high-permittivity insulating material. Therefore, according to the study of the inventors, as shown in FIG. 29, the trapping/detrapping of the charge (electron in FIG. 29) is noticeably generated in the area where edge portions of the floating gate electrode and control gate electrode to which the high voltage is applied faces each other, which results in the generation of the memory malfunction caused by the variation in threshold of the memory cell.

However, in the present embodiment, by providing the interelectrode insulating film 204 (204$_1$ and 204$_2$) satisfying r1>r2, the suppression of leakage current and the improvement of the dielectric breakdown are realized and the charge transfer between the adjacent floating gate electrodes 102 is decreased when the high voltage is applied between the floating gate electrode 102 and the control gate electrode 105, and hence the charge retaining property of the memory cell is ensured.

That is, as the low-electric field leakage current which is caused by a trapping level of the first interelectrode insulating film 204$_1$ including the metal oxide film having the high oxygen composition ratio is suppressed, the charge transfer is not generated in the first interelectrode insulating film 204$_1$ between the adjacent floating gate electrodes 102.

On the other hand, when the high electric field is applied to the second interelectrode insulating film 204$_2$ including the metal oxide film having the low oxygen composition ratio, the injection charge is captured in the metal oxide film, therefore, the leakage current is suppressed, and the dielectric breakdown is improved.

In addition, in order to suppress the charge transfer in the interelectrode insulating film between the adjacent floating gate electrodes, it is only necessary that a part of the area between the adjacent floating gate electrodes is set in low-trap level density. Therefore, for instance, as shown in FIG. 15, among the interelectrode insulating film 204 between the adjacent floating gate electrodes 102, a portion 204$_3$ on the side face of the floating gate electrode 102 is slightly decreased in the oxygen composition ratio, the compatibility of assurance of the high-electric-field resistance of the interelectrode insulating film 204 and decrease in charge transfer between the adjacent floating gate electrodes can easily be realized.

In addition, the single-layer interelectrode insulating film is described in FIGS. 14 and 15, the effect of the embodiment can also be obtained even with the multi-layer interelectrode insulating film in which the insulating films having different materials are laminated. In a case of the multi-layer interelectrode insulating film, it is desirably that the high-quality insulating film such as a silicon oxide film in which low-electric field leakage current due to the in-film trapping level is hard to occur is located on the lower side of the multi-layer interelectrode insulating film.

In addition, in FIGS. 1 and 2, the whole of the interelectrode insulating film between the adjacent floating gate electrodes has the oxygen composition ratio higher than that of the interelectrode insulating film on the top surface of the floating gate electrode, however, the effect of the embodiment can also be obtained in a case where a part of the interelectrode insulating film between the adjacent floating gate electrodes has the oxygen composition ratio higher than that of the interelectrode insulating film on the top surface of the floating gate electrode. Further, the effect of the embodiment can also be obtained in a case where a part of the interelectrode insulating film except between the adjacent floating gate electrodes has the lower oxygen composition ratio.

Figure 16:
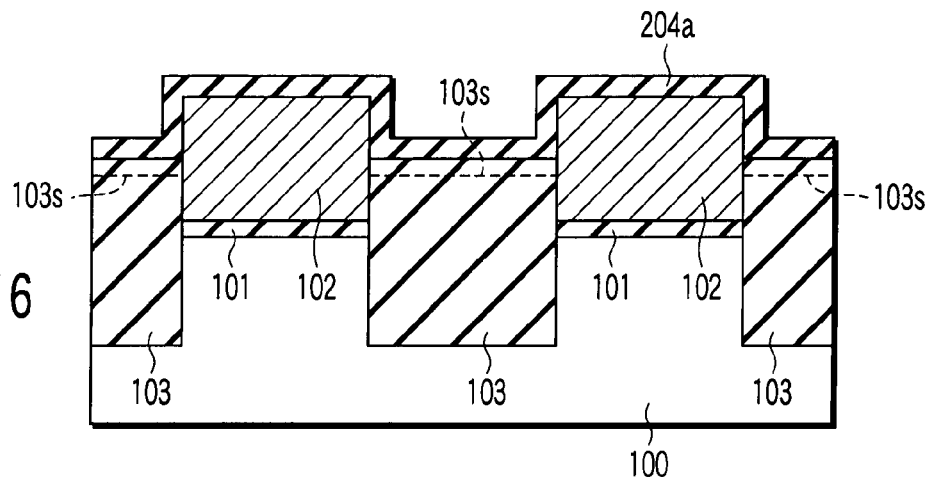
FIG. 16 is a cross-section view showing a first method for manufacturing the nonvolatile memory cell of the second embodiment.
Figure 17:
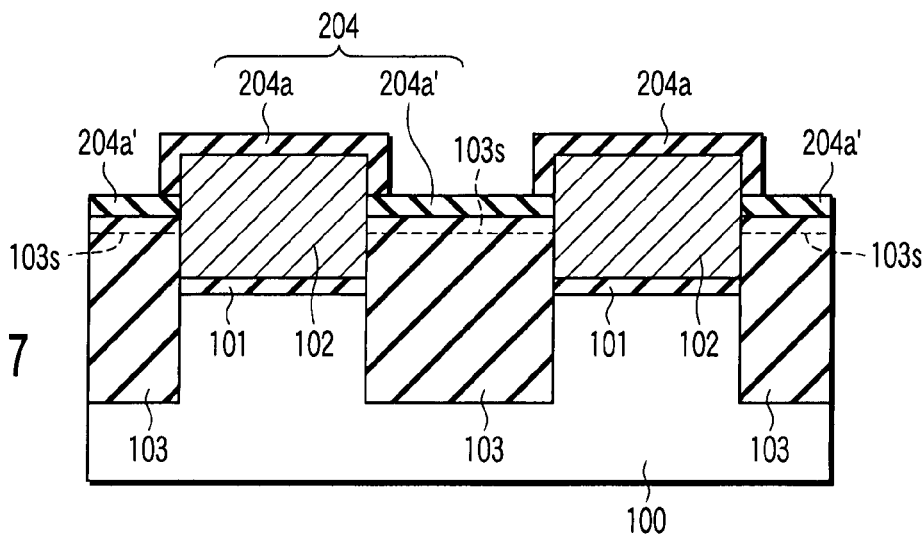
FIG. 17 is a cross-section view showing the first method for manufacturing the nonvolatile memory cell of the second embodiment following FIG. 16.

A first method for manufacturing the nonvolatile memory cell of the second embodiment will be described below with reference to FIGS. 16 and 17. FIGS. 16 and 17 are cross-section views in the word line direction (channel width direction).

First, the processes from FIGS. 3A and 3B to FIGS. 5A and 5B of the first embodiment are performed.

Next, as shown in FIG. 16, the whole of the substrate is dipped in aqueous solution to cause the moisture to penetrate in a surface layer region 103s (the thickness is one atomic layer or more and 100 nm or less) of the isolation insulating film 103 including silicon oxide with the concentration of about 1%. Next, a hafnium silicate film 204a having the thickness of 20 nm to be the interelectrode insulating film is deposited on the entire surface by ADL method. The deposition is performed at a low temperature of about 300° C. such that the moisture remains in the surface layer region 103s of the isolation insulating film 103.

Next, the heating process is performed at about 900° C. to thermally diffuse the moisture of the surface layer region 103s of the isolation insulating film 103 into the hafnium silicate film 204a between the adjacent floating gate electrodes 102. Thereby, as shown in FIG. 17, the hafnium silicate film 204a between the adjacent floating gate electrodes 102 is converted into a hafnium silicate film 204a' having the high oxygen composition ratio.

The hafnium silicate film 204a' corresponds to the first interelectrode insulating film $204_1$ of FIG. 14, and the hafnium silicate film 204a corresponds to the second interelectrode insulating film $204_2$ of FIG. 14. Thereafter, as the first embodiment, the nonvolatile memory cell is completed by using known techniques.

By the first manufacturing method, the interelectrode insulating film 204 in which the interelectrode insulating film 204a' between the adjacent floating gate electrodes 102 has higher oxygen composition ratio than other part of the interelectrode insulating film 204 is realized.

In addition, in the present method, the moisture is used as the oxygen supply origin, and the oxygen supply source is formed by dipping the oxygen supply origin in the aqueous solution. However, the oxygen supply origin is not limited to the moisture, and another method may be adopted as the method for forming the oxygen supply source. For example, after the processing steps of control gate electrode and the floating gate electrode (steps in FIGS. 8A and 8B), oxygen may be supplied into the interelectrode insulating film between the adjacent floating gate electrodes by thermally diffusing oxygen gas through the isolation insulating film (for example, silicon oxide film) from the exposed portion of the isolation insulating film which is not covered with the control gate electrode and the floating gate electrode. Moreover, the method for introducing oxygen into the interelectrode insulating film is not limited to the thermal diffusion. Further, in the present method, the example of the hafnium silicate film is shown, the same effect is obtained in other metal oxide films.

Figure 18:
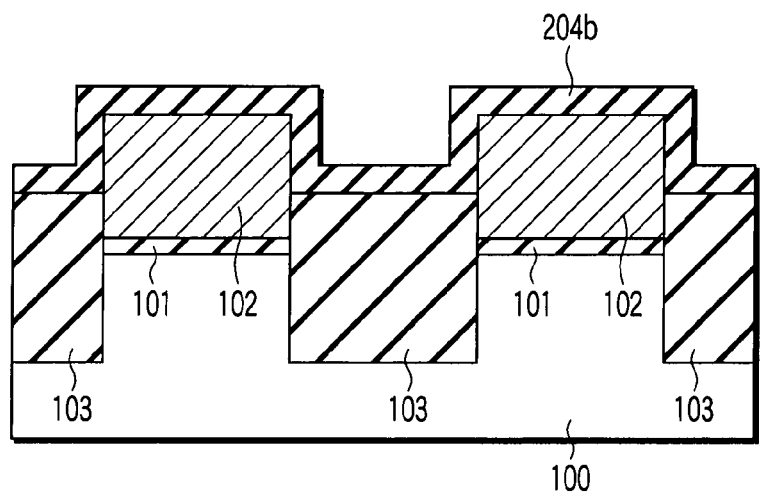
FIG. 18 is a cross-section view showing a second method for manufacturing the nonvolatile memory cell of the second embodiment.
Figure 19:
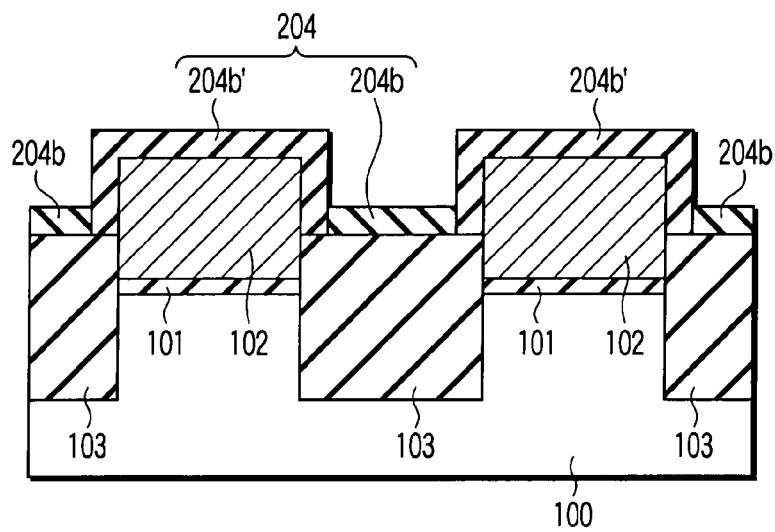
FIG. 19 is a cross-section view showing the second method for manufacturing the nonvolatile memory cell of the second embodiment following FIG. 18.

FIGS. 18 and 19 are cross-section views showing a second manufacturing method.

First, the processes from FIGS. 3A and 3B to FIGS. 5A and 5B of the first embodiment are performed. However, aluminum is previously introduced into the phosphorous-doped polycrystalline silicon layer 102 to be the floating gate electrode with the concentration of about 1% by ion implantation or the like.

Next, as shown in FIG. 18, an alumina film 204b having the thickness of 20 nm to be the interelectrode insulating film is deposited on the entire surface by ADL method.

Next, by performing heating process at about 900° C., aluminum in the polycrystalline silicon layer 102 is thermally diffused into the alumina film 204b on the top surface and side face of the floating gate electrode 102, thereby, as shown in FIG. 19, the alumina film 204b on the top surface and side face of the floating gate electrode 102 is converted into an alumina film 204b' having the low oxygen composition ratio.

The alumina film 204b and 204b' correspond to the first interelectrode insulating film $204_1$ and $204_2$ of FIG. 14. Thereafter, as the first embodiment, the nonvolatile memory cell is completed by using known techniques.

By the second manufacturing method, the interelectrode insulating film 204 in which the interelectrode insulating film 204b' on the top surface and side face of the floating gate electrode 102 has lower oxygen composition ratio than other part of the interelectrode insulating film 204b is realized.

In addition, in the present method, the polycrystalline silicon layer to be the floating gate electrode is used as the aluminum supply source, however, the aluminum supply source is not limited to the polycrystalline silicon layer. Moreover, the method for introducing aluminum into the polycrystalline silicon layer is not limited to the ion implantation, and the method for introducing aluminum into the interelectrode insulating film is not limited to the thermal diffusion.

Further, in the present method, the example of the alumina film is shown, the same effect is obtained in other metal oxide films. Moreover, the same effect of the embodiment is obtained even if the low oxygen composition ratio is partially formed by introducing metal different from the metal constituting the metal oxide film.

Further, by combining the first manufacturing method and the second manufacturing method, the interelectrode insulating film 204 ($204_1$, $204_2$, and $204_3$) having the oxygen composition ratio shown in FIG. 15 is formed.

Figure 20:
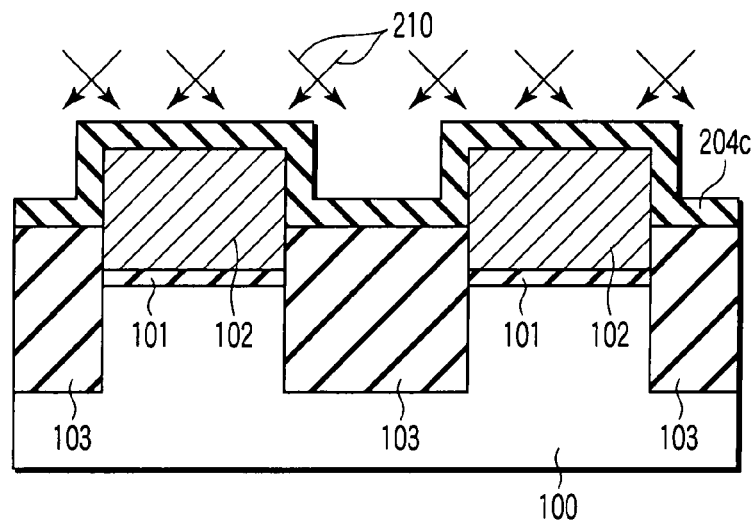
FIG. 20 is a cross-section view showing a third method for manufacturing the nonvolatile memory cell of the second embodiment.
Figure 21:
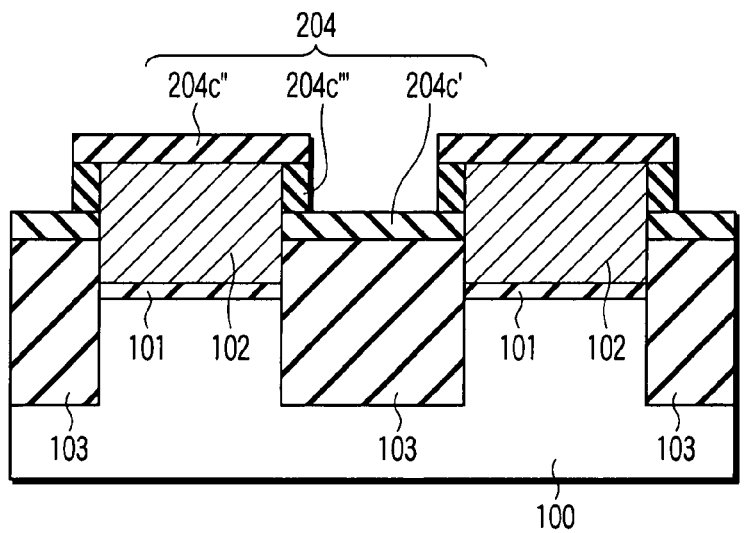
FIG. 21 is a cross-section view showing the third method for manufacturing the nonvolatile memory cell of the second embodiment following FIG. 20.

FIGS. 20 and 21 are cross-section views showing a third manufacturing method.

First, the processes from FIGS. 3A and 3B to FIGS. 5A and 5B of the first embodiment are performed.

Next, as shown in FIG. 20, an alumina film 204c having the thickness of 20 nm to be the interelectrode insulating film is deposited on the entire surface by ADL method. Thereafter, ion implantation of the aluminum element 210 is performed over the entire surface under the conditions of the incident angle of about 30° and the dosage of about $1 \times 10^{15}$ atoms/cm$^2$ to introduce the aluminum element into the alumina film 204c on the top surface and side face of the floating gate electrode 102 and into the alumina film 204c between the adjacent floating gate electrodes 102.

Next, by performing heating process at about 900° C., the introduced aluminum element is incorporated into a network structure of the alumina film 204c and bonded with the network structure. Thereby, as shown in FIG. 21, the alumina film 204c is converted into aluminum-contained alumina films 204c', 204c'', and 204c'''. The aluminum-contained alumina films 204c', 204c'', and 204c''' correspond to the interelectrode insulating film $204_1$, $204_2$, and $204_3$ of FIG. 15 respectively. Thereafter, the nonvolatile memory cell is completed by using known techniques.

By the third manufacturing method, the oxygen composition ratio of the interelectrode insulating film is changed according to the aluminum content. That is, the aluminum-contained alumina film 204c'' on the top surface of the floating gate electrode 102 has the lowest oxygen composition ratio, the aluminum-contained alumina film $204c'''$ on the upper side face of the floating gate electrode 102 has the second lowest oxygen composition ratio, and the aluminum-contained alumina film $204c'$ between the adjacent floating gate electrodes 102 has the highest oxygen composition ratio.

In addition, in the present method, the metal element is introduced by oblique ion implantation, certainly, another method may be adopted. Further, in the present method, the example of introducing the aluminum element into the alumina film is shown, the same effect is obtained even with other insulating film materials. Moreover, the same effect of the embodiment is obtained even if the low oxygen composition ratio is partially formed by introducing metal different from the metal constituting the metal oxide film.

Third Embodiment

FIG. 22 is a cross-section view showing a nonvolatile memory cell according to a third embodiment, the section being taken in a bit-line direction (channel length direction).

An interelectrode insulating film 301 of FIG. 22 comprises for example first and second interelectrode insulating films $301_1$ and $301_2$ including metal oxide. The second interelectrode insulating film $301_2$ is provided on the side face of the first interelectrode insulating film $301_1$. In other words, in the interelectrode insulating film 301, the central portion area is the first interelectrode insulating film $301_1$, and the edge portion areas of the control/floating gate electrode is the second interelectrode insulating film $301_2$.

The oxygen composition ratio (oxygen concentration) of the first interelectrode insulating film $301_1$ is lower than the oxygen composition ratio (oxygen concentration) of the second interelectrode insulating film $301_2$. The first and second interelectrode insulating films $301_1$ and $301_2$ having the above oxygen composition ratios (oxygen concentrations) are realized by supplying a relatively large amount of oxygen to the edge portion areas of the control/floating gate electrodes after the control/floating gate electrodes are processed.

The interelectrode insulating film 301 of FIG. 22 may comprise the interelectrode insulating films $301_1$ and $301_2$ having a multi-metal oxide including metal elements. In this case, the charge trap state density of the first interelectrode insulating film $301_1$ is set larger than the charge trap state density of the second interelectrode insulating film $301_2$. The first and second interelectrode insulating films $301_1$ and $301_2$ having the above charge trap state density distributions are realized by changing the composition ratio of the metal elements to set the charge trap state density in the edge portion areas of the control/floating gate electrode lower than the charge trap state density in the central portion area. For example, in case of the interelectrode insulating film includes a hafnium aluminate, when the hafnium content is decreased by increasing the aluminum content in the edge portion areas of the control/floating gate electrodes, the charge trap state density in the edge portion areas of the control/floating gate electrodes becomes lower than that in the central portion area. This charge trap state density distribution corresponds to an oxygen deficiency density distribution. That is, as the charge trap state density is decreased, the oxygen deficiency is decreased and the oxygen composition ratio is increased. This correspondence is a novel fact which the inventors found out through the experiments.

By providing such the interelectrode insulating film 301 ($301_1$ and $301_2$), the suppression of leakage current and the improvement of the dielectric breakdown are realized and the variation in threshold of the memory cell caused by charge trapping/detrapping at edge portion of the control/floating gate electrode is decreased when the high voltage is applied between the floating gate electrode 102 and the control gate electrode 105, and hence he memory malfunction is avoided.

That is, when the high electric field is applied to the central portion area of the first interelectrode insulating film $301_1$ including metal oxide film having the low oxygen composition ratio, the injection charge is captured in the metal oxide film, so that the leakage current is suppressed and the dielectric breakdown is improved.

On the other hand, the electric field intensity in the edge portion areas of the control/floating gate electrode is increased due to the electrode shape, so that the charge trapping/detrapping phenomenon becomes noticeable, however, the metal oxide film having the high oxygen composition ratio shows the low charge trap state density therein, the variation in threshold of the memory cell caused by the charge trapping/detrapping becomes sufficiently negligible.

In addition, in FIG. 22, the example of the single-layer interelectrode insulating film is shown, the effect of the embodiment can also be obtained in the case of a multi-layer interelectrode insulating film in which insulating films made of different materials are laminated. In a case of the multi-layer interelectrode insulating film, it is desirably that the high-quality insulating film such as a silicon oxide film in which low-electric field leakage current due to the in-film trapping level is hard to occur is located on the lower side of the multi-layer interelectrode insulating film.

Next, a first method for manufacturing the nonvolatile memory cell of the third embodiment will be described below with reference to FIG. 23.

First, the processes from FIGS. 3A and 3B to FIGS. 9A and 9B of the first embodiment are performed.

Next, as shown in FIG. 23, the whole of the substrate is dipped in the aqueous solution to cause moisture 303 to penetrate into the interlayer insulating film 109 with the concentration of about 1%.

Next, by performing heating process at about 900° C., the moisture 303 introduced into the interlayer insulating film 109 is diffused into the interelectrode insulating film 104 including metal oxide on the edge portion of the control/floating gate electrode, further, the introduced moisture 303 is incorporated into a network structure of the interelectrode insulating film 104 and bonded with the network structure, so that the oxygen composition ratio of the interelectrode insulating film 104 on the edge portion of the control/floating gate electrode is increased. Thereafter, the nonvolatile memory cell is completed by using known techniques.

By the first method, the interelectrode insulating film in which the edge portion area on the control/floating gate electrode has higher oxygen composition ratio than other area is realized. In the present method, the moisture is used as the oxygen supply origin, and the oxygen supply source is formed by dipping the oxygen supply origin in the aqueous solution. However, the oxygen supply origin is not limited to the moisture, and another method may be adopted as the method for forming the oxygen supply source. Moreover, the method for introducing oxygen into the interelectrode insulating film is not limited to the thermal diffusion. Further, the interelectrode insulating film in which the edge portion area on the control/floating gate electrode has higher oxygen composition ratio than other area is also realized by introducing metal element into the central portion area of the electrode.

Figure 24:
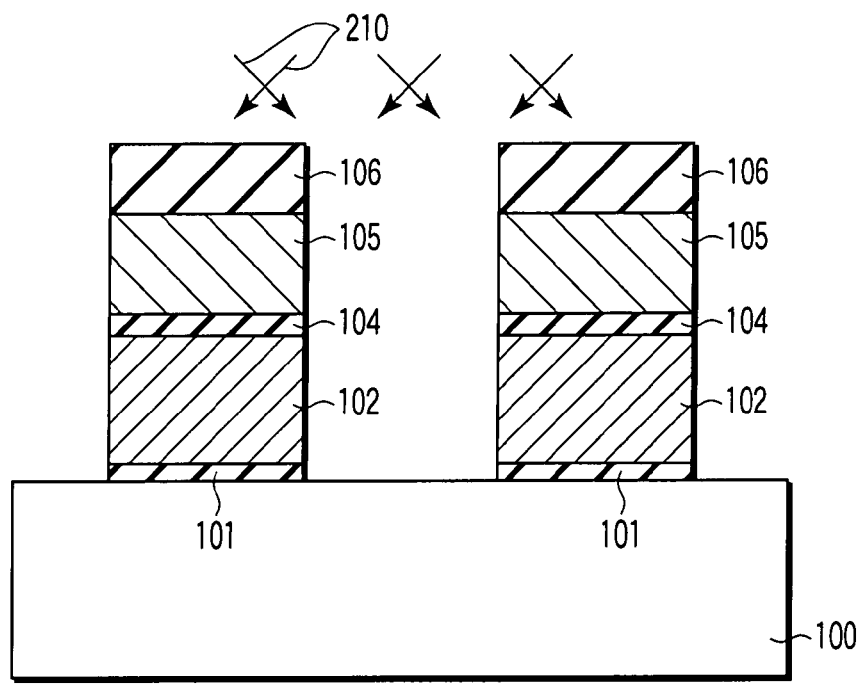
FIG. 24 is a cross-section view showing a second method for manufacturing the nonvolatile memory cell of the third embodiment.

FIG. 24 is a cross-section view showing a second manufacturing method.

First, the processes from FIGS. 3A and 3B to FIGS. 8A to 8B of the first embodiment are performed. Here, the interelectrode insulating film 104 is an insulating film including hafnium aluminate.

Next, ion implantation of the aluminum element 210 is performed over the entire surface under the conditions of the incident angle of about 30° and the dosage of about $1 \times 10^{15}$ atoms/cm$^2$ to introduce the aluminum element 210 into the interelectrode insulating film 104 on the edge portion of the control/floating gate electrode.

Next, by performing oxidizing atmosphere annealing at about 900° C., the introduced aluminum element is incorporated into a network structure of the interelectrode insulating film 104 and bonded with the network structure. Thereafter, the nonvolatile memory cell is completed by using known techniques.

By the second method, the interelectrode insulating film in which the edge portion area on the control/floating gate electrode has lower charge trap state density than other area is realized. In addition, in the present method, the element causing the low charge trap state density is introduced by oblique ion implantation, certainly, other method may be adopted. Further in the present method, the example of introducing aluminum element into the hafnium aluminate film is shown, however, as long as the above charge trap state density distribution is realized, the same effect is obtained by introducing another element or by the combination of another film and another element. Further, the interelectrode insulating film in which the edge portion area on the control/floating gate electrode has lower charge trap state density than other area is also realized by introducing metal element causing the high charge trap state density into the central portion of the interelectrode insulating film.

Figure 25:
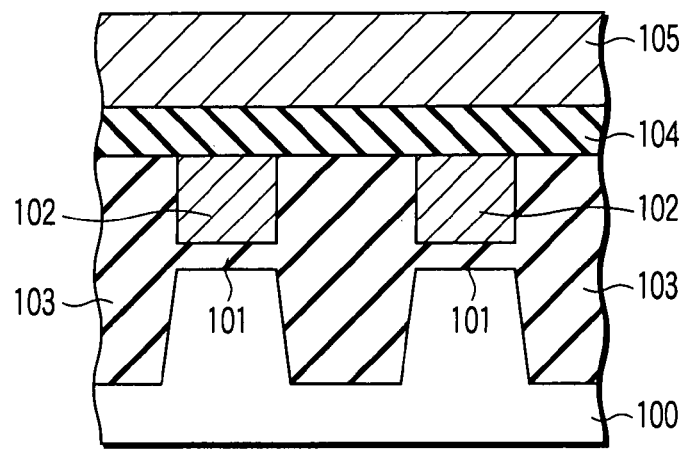
FIG. 25 is a cross-section view explaining another embodiment.

The embodiments of the invention are not always applied only to the memory cell structures shown in FIGS. 1, 2, 14, 15, and 22. For example, as shown in FIG. 25, the invention can be applied to the case in which the interelectrode insulating film 104 has the substantially flat (planarized) structure.

Figure 26:
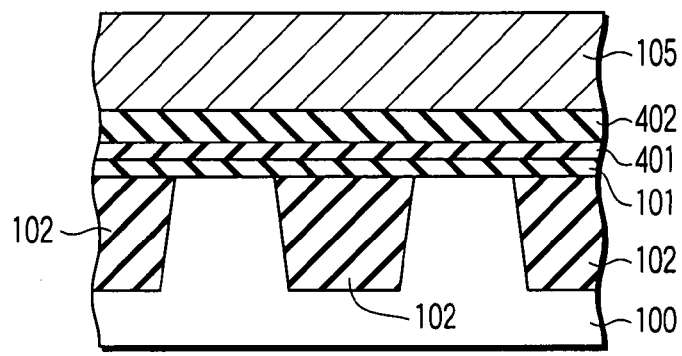
FIG. 26 is a cross-section view explaining still another embodiment.

Further, as shown in FIG. 26, relating to the MONOS type nonvolatile memory which stores the charge in an insulating film, the same effect is obtained when the high-permittivity insulating film is used as a charge storage film 401 or a charge block insulating film 402.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a plurality of nonvolatile memory cells provided on the semiconductor substrate,
    each of the plurality of nonvolatile memory cells comprising:
    a first insulating film provided on the semiconductor substrate,
    a charge storage layer provided on the first insulating film,
    a control gate electrode provided above the charge storage layer, and
    a second insulating film provided between the control gate electrode and the charge storage layer, the second insulating film between adjacent charge storage layers including a first region having permittivity lower than that of the second insulating film on a top surface of the charge storage layer in a cross-section view of a channel width direction of the nonvolatile memory cell, the first region having composition differing from that of the second insulating film on the top surface of the charge storage layer, the first region being configured to connect the adjacent charge storage layers and be in direct contact with the control gate electrode.

2. The semiconductor device according to claim 1, further comprising a second region provided on a side face of the charge storage layer, and wherein the second region has permittivity which is lower than that of the second insulating film on the top surface of the charge storage layer and higher than permittivity of the first region.

3. The semiconductor device according to claim 1, wherein the first insulating film is a tunnel insulating film, the second insulating film is an interelectrode insulating film, and the charge storage layer is a floating gate electrode.

4. A semiconductor device comprising:
    a semiconductor substrate;
    a plurality of nonvolatile memory cells provided on the semiconductor substrate,
    each of the plurality of nonvolatile memory cells comprising:
    a first insulating film provided on the semiconductor substrate,
    a charge storage layer provided on the first insulating film,
    a control gate electrode provided above the charge storage layer,
    a second insulating film including metal oxide and provided between the control gate electrode and the charge storage layer, the second insulating film between adjacent charge storage layers including a first region comprising metal oxide having oxygen composition ratio higher than that of the second insulating film on a top surface of the charge storage layer in a cross-section view of a channel width direction of the nonvolatile memory cell, and the first region being configured to connect the adjacent charge storage layers.

5. The semiconductor device according to claim 4, further comprising a second region provided on a side face of the charge storage layer, and wherein the second region has oxygen composition ratio which is higher than that of the second insulating film on the top surface of the charge storage layer and lower than oxygen composition ratio of the first region.

6. The semiconductor device according to claim 4, wherein the first insulating film is a tunnel insulating film, the second insulating film is an interelectrode insulating film, and the charge storage layer is a floating gate electrode.

7. A semiconductor device comprising:
    a semiconductor substrate;
    a plurality of nonvolatile memory cells provided on the semiconductor substrate,
    each of the plurality of nonvolatile memory cells comprising:
    a first insulating film provided on the semiconductor substrate,
    a charge storage layer provided on the first insulating film,
    a control gate electrode provided above the charge storage layer,
    a second insulating film including metal oxide and provided between the control gate electrode and the charge storage layer, the second insulating film between an edge portion of the charge storage layer and an edge portion of the control gate electrode including a region having oxygen concentration higher than that of the second insulating film between a central portion of the charge storage layer and a central portion of the control gate electrode in a cross-section view of a channel length direction of the nonvolatile memory cell.

8. The semiconductor device according to claim 7, wherein the metal oxide in the second insulating film between the edge portion of the charge storage layer and the edge portion of the control gate electrode has oxygen composition ratio which is higher than that of the second insulating film between the central portion of the charge storage layer and the central portion of the control gate electrode.

9. The semiconductor device according to claim 7, wherein the first insulating film is a tunnel insulating film, the second insulating film is an interelectrode insulating film, and the charge storage layer is a floating gate electrode.

10. A semiconductor device comprising:
a semiconductor substrate;
a plurality of nonvolatile memory cells provided on the semiconductor substrate,
each of the plurality of nonvolatile memory cells comprising:
a first insulating film provided on the semiconductor substrate,
a charge storage layer provided on the first insulating film,
a control gate electrode provided above the charge storage layer,
a second insulating film including metal oxide comprising two or more kinds of metals and provided between the control gate electrode and the charge storage layer, the second insulating film between an edge portion of the charge storage layer and an edge portion of the control gate electrode including a region having charge trap state density lower than that of the second insulating film between a central portion of the charge storage layer and a central portion of the control gate electrode in a cross-section view of a channel length direction of the nonvolatile memory cell.

11. The semiconductor device according to claim 10, wherein composition ratio of the metal oxide in the second insulating film between the edge portion of the charge storage layer and the edge portion of the control gate electrode is different from composition ratio of the metal oxide in the second insulating film between the central portion of the charge storage layer and the central portion of the control gate electrode.

12. The semiconductor device according to claim 10, wherein the first insulating film is a tunnel insulating film, the second insulating film is an interelectrode insulating film, and the charge storage layer is a floating gate electrode.

* * * * *